(12) United States Patent
Kajitani

(10) Patent No.: US 6,285,589 B1
(45) Date of Patent: Sep. 4, 2001

(54) NON-VOLATILE SEMICONDUCTOR MEMORY APPARATUS

(75) Inventor: Masanori Kajitani, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/049,311

(22) Filed: Mar. 27, 1998

(30) Foreign Application Priority Data

Mar. 31, 1997 (JP) .................................... 9-081479
Jul. 23, 1997 (JP) .................................... 9-197569

(51) Int. Cl.$^7$ .................................... G11C 16/06
(52) U.S. Cl. .................... 365/185.2; 365/185.19
(58) Field of Search .................... 365/185.2, 185.21, 365/185.22, 185.19

(56) References Cited

U.S. PATENT DOCUMENTS 5,608,679 * 3/1997 Mi ................................. 365/185.33
5,712,815 * 1/1998 Bill ................................. 365/185.33
5,912,838 * 5/1999 Chevallier ..................... 365/185.03

* cited by examiner

*Primary Examiner*—A. Zarabian
(74) *Attorney, Agent, or Firm*—Hogan & Hartson, L.L.P.

(57) ABSTRACT

Disclosed is a non-volatile semiconductor memory apparatus, having floating gate electrodes, from which multi-value data can be accurately read out. A memory cell transistor (40) is provided in a row with a plurality of reference transistors (50), and a plurality of such rows are selectively connected by a word line (43). Reference potentials (Va~Vc) are written to the reference transistors (50) simultaneous to the writing of data to the memory cell transistor (40). In read mode, following the completion of the writing operation, memory data is determined by comparing reference potentials (VR1~VR3) which have been read out from the reference transistors (50), with a potential (VBL) which has been read out from the memory cell transistor (40).

9 Claims, 7 Drawing Sheets

NON-VOLATILE SEMICONDUCTOR MEMORY APPARATUS

BACKGROUND OF THE INVENTION

1. Field of the Invention

The present invention relates to a non-volatile semiconductor memory apparatus in which multi-value data can be stored using memory cell transistors with floating gate electrodes.

2. Description of the Prior Art

In a programmable ROM (EEPROM: Electrically Erasable Programmable ROM) which has multiple memory cells, each comprising a single transistor, and which is capable of electrically erasing data stored in the memory cells, each memory cell comprises a double-gate transistor which has a floating gate electrode and a control gate electrode. A memory cell transistor with this type of double-gate structure writes data by accelerating hot electrons, generated on the drain region side of the control gate electrode, and injecting them into the floating gate electrode. Data is read out by detecting the difference in the operating characteristics of the memory cell transistor when electrical charge is injected at the floating gate electrode and when no charge being is injected.

FIG. 1 shows a front view of a memory cell portion of a conventional non-volatile semiconductor memory apparatus having floating gate electrodes, and FIG. 2, a cross-sectional view taken along the line X—X. These diagrams show a split gate structure wherein a portion of a control gate electrode is provided alongside a floating gate electrode.

A plurality of separate regions, comprising strips of oxide film (LOCOS) having selected thicknesses, are disposed on the surface of a P-type silicon substrate 1, the element regions being partitioned. Floating gate electrodes 4 are disposed on the silicon substrate 1, with oxide films 3 provided therebetween, so as to straddle adjacent separating regions 2. Each of the floating gate electrodes 4 is provided independently for one memory cell. And, thick oxide films 5 are disposed above the centers of the floating gate electrodes 4, at acute angles to the ends of the floating gate electrodes 4, in order to increase electromagnetic concentration at the ends of the floating gate electrodes 4 when data is erased. Control gate electrodes 6 are disposed on the silicon substrate 1, with one control gate electrode 6 corresponding to each row of multiple floating gate electrodes 4. One part of the control gate electrode 6 overlaps the floating gate electrodes 4, and the remaining part is disposed over the silicon substrate 1 with the oxide film 3 therebetween. Further, adjacent rows of floating gate electrodes 4 and control gate electrodes 6 are provided so that their surfaces are symmetrical to each other. Multiple N-type first diffusion layers 7 and N-type second diffusion layers 8 are provided in the substrate regions between the control gate electrodes 6 and the substrate regions between the floating gate electrodes 4. The first diffusion layers 7 are provided independently between the control gate electrodes 6 and are separated by the separating regions 2. By contrast, the second diffusion layers 8 continue parallel to the lengths of the control gate electrodes 6. Thus, each memory cell transistor comprises a floating gate electrode 4, a control gate electrode 6, a first diffusion layer 7 and a second diffusion layer 8. Aluminium lines 10 are provided over the control gate electrodes 6, with an oxide layer therebetween, so as to intersect with the control gate electrodes 6. The aluminium lines 10 pass through control holes 11 and connect to the first diffusion layers 7.

In a double-gate memory cell transistor of the above type, the ON resistance between the source and the drain fluctuates in accordance with the amount of charge which is injected to the floating gate electrode 4. Therefore, the ON resistances of the memory cell transistors are individually varied by injecting separate charges into the floating gate electrodes 4. The resulting differences in operating characteristics of the memory cell transistors correspond to data which are stored. For example, data of four values (equivalent to two bits) can be stored in one memory cell transistor by injecting charge to the floating gate electrode 4 in four steps and reading out the resistances of the memory cell transistor in four steps.

FIG. 3 is a circuit diagram showing the memory cell portion of FIG. 1. As FIG. 3 shows, four rows and four columns of memory cells are provided.

The control gate electrodes 6 of the double-gate memory cells 20 are connected to word lines 21, and the first diffusion layers 7 and the second diffusion layers 8 are connected to bit lines 22 and source lines 23 respectively. The bit lines 22 connect, via selective transistors 24, to a data wire 25, which is connected to a read load resistor 26. The source lines 23 connect to a power line 27. A write clock φW is applied along the power line 27 to each of the source lines 23, and a read clock φR is applied from the data wire 25, via the read load resistor 26, to each of the bit lines 22.

Normally, the control gate electrodes 6, which are provided along each row of memory cell transistors 20, function as the word lines 21, and the aluminium lines 10, which are connected to the first diffusion layers 7, function as the bit lines 22. Furthermore, the second diffusion layers 8, which run parallel to the control gate electrodes 6, are used as the source lines 23.

Row selecting signals LS1~LS4, which are based on row address data, activate specific wires of the memory cell transistors 20 by selecting one of the word lines 21.

Column selecting signals CS1~CS4, which are based on column address data, activate specific columns of the memory cell transistors 20 by switching one of the selective transistors 24 ON. Thus, by means of row address data and column address data, it is possible to specify any one of the multiple memory cell transistors arranged in columns and rows, and to connect the specified transistor to the data wire 25.

Data is written into the memory cell transistors 20 by injecting charge to the floating gate electrodes 4. More concretely, a ground potential (for instance, 0V) is applied from the data wire 25 to the memory cell transistors 20, while a write power potential (for instance, 12V) is applied from the power line 26 to the memory cell transistors 20. As a result, data is written (i.e. charge is injected to the floating gate electrode 4) at the memory cell transistor 20 which has been activated by the selecting signals LS1~LS4 and CS1~CS4. Also, data is read out from the memory cell transistors 20 by detecting the resistances when the memory cell transistors 20 have been switched ON. More concretely, a power potential for reading (for instance, 2V) is applied to the memory cell transistors from the data wire 25 and a ground potential (for instance, 0V) is applied to the memory cell transistors 20 from the power line 26. Here, sense amplifiers (not shown in the diagram), which are connected to each of the bit lines 22, detect the ON resistances of the memory cell transistors 20.

In order to improve recording precision when writing multi-value data (or analog data) into the memory cell transistors 20, the operations of charge injection (writing)

and identification of charge amounts (reading) are performed repeatedly in short cycles. In other words, data are gradually written to the memory cell transistors 20 while simultaneously being read, and the writing ends when the data which have been read out match the contents of the data being recorded.

FIG. 4 depicts waveforms for the write clock φW and the read clock φR. As FIG. 4 shows, the write clock φW is, for instance, set to rise only during fixed periods in a fixed cycle, and is applied to the memory cell transistors 20 from the power line 27 via the source lines 23. Then, the data wire 25 is lowered to ground potential in synchronism with the write clock φW. Therefore, during the periods when the write clock φW is rising, current from the source line 23 is passed through a selected memory cell transistor 20 to the bit line 22, whereby an electrical charge is injected to the floating gate electrode 4 of the selected memory cell transistor 20.

Furthermore, as FIG. 4 shows, the read clock φR is, for instance, set so that the pulse rises only during the leisure times in the write clock φW, and is applied to the memory cell transistors 20 from the data wire 25 via the bit lines 22. As a result, the power line 27 is lowered to ground potential in synchronism with the read clock φR. Therefore, during the period when the read clock φR is rising, current from the data wire 25 flows to the power line 27 through the resistor 26 and the selected memory cell transistor 20. The potential of the bit line 22, which changes in accordance with the ratio between the ON resistance of the memory cell transistor 20 and the resistance of the read load resistor 26, is read out by the sense amplifier connected to the bit line 22. The read/write cycle described above is therefore repeated until the potential read out by the sense amplifier corresponds to the value of the data to be written.

FIG. 5 is a block diagram showing the configuration of a sense amplifier for detecting the ON resistance of the memory cell transistor 20 which is connected to the bit lines 22.

As FIG. 5 shows, the sense amplifier comprises a pair of load resistors 31 and 32, a pair of current amplifiers 33 and 34, a reference transistor 35, a fixed potential generator 36, a differential amplifier 37 and a determining/controlling circuit 38. The pair of load resistors 31 and 32, which have identical resistances, connect to a power source. The pair of current amplifiers 33 and 34 each comprise a transistor and an inverter, and are connected respectively to the pair of load resistors 31 and 32, which connect to the power. The data wire 25, which the memory cell transistors 20 are selectively connected to, connects to current amplifier 33. The reference transistor 35 connects to current amplifier 34. The resistance at the reference transistor 35 is varied in response to a reference potential VRG, which is applied to the gate of the reference transistor 35. This reference potential VRG, which corresponds to multi-value data to be stored in the memory cell transistor 20, is generated and supplied to the gate of the reference transistor 35 by the fixed potential generator 36. For instance, when data of four values (equivalent to two bits) are to be stored in the memory cell transistor 20, the fixed potential generator 36 sequentially supplies three types of gate potentials VRG to the reference transistor 35, with the result that the resistance of the reference transistor 35 is altered in three steps.

The two input circuits of the differential amplifier 37 connect to the connections between pair of load resistors 31 and 32 and the pair of current amplifiers 33 and 34. The differential amplifier 37 compares the potentials VBL and VRL at each of the two connections and outputs the result of the comparison CO to the determining/controlling circuit 38. The determining/controlling circuit 38 controls the reference potential which is generated by the fixed potential generator 36. In addition, the determining/controlling circuit 38 determines the result of the comparison CO and plays back multi-bit data which corresponds to multi-value data. For instance, when determining data of four values, the upper bit is first determined by generating the middle potential of the three-step reference potentials. Then, the highest potential or the lowest potential of the three-step reference potentials is generated, in accordance the upper bit which has been determined, enabling the lower bit to be determined.

When data is read out from the memory cell transistor 20, the source side of the memory cell transistor 20 connects to ground, and the memory cell transistor 20 and the load resistor 31 are connected in series, via the current amplifier 33, at a point between the power and the ground. Similarly, the load resistor 32 and the reference transistor 35 are connected in series, via the current amplifier 34, at a point between the power and the ground. In the present case, the potential VBL at the connection between the load resistor 31 and the current amplifier 33 is determined in accordance with the ratio of the drive capabilities of load resistor 31 and memory cell transistor 20. Similarly, the potential VRL at the connection between the load resistor 32 and the current amplifier 34 is determined in accordance with the ratio of the drive capabilities of load resistor 32 and reference transistor 35. Consequently, in the case where the resistances of the reference transistor 35 are switched sequentially in steps, based on the comparison carried out by the differential amplifier 37, it is possible to determine which of these resistance regions the resistance of the memory cell transistor corresponds to. This type of sense amplifier is disclosed, for instance, in 1995 IEEE/International Solid-State Circuit Conference/Session 7/Flash Memory/Paper TA 7.7.

In the sense amplifier described above, which reads out the resistance ratio between the memory cell transistor 20 and the load resistor 31 and the resistance ratio between the reference transistor 35 and the load resistor 32, the settings of the resistances of the load resistors 31 and 32 are important. Normally, the resistances of load resistors 31 and 32 are set in accordance with the resistance of the memory cell transistor 20. When the resistances of the load resistors 31 and 32 are greater or lower than the optimum value, the change in the connection potential VBL will decrease with respect to change in the resistance of the memory cell transistor 20. In other words, when the settings of the resistances of the load resistors 31 and 32 deviate from the optimum, there is the problem that the differential amplifier 37 will not be able to correctly read out the changes in the potentials VBL and VRL at the connection points.

Furthermore, since the operating characteristics of the reference transistor 35 and the fixed potential generator 36 influence the potential VRL, which is used as the determining reference for the differential amplifier 37, it is essential that the reference transistor 35 and the fixed potential generator 36 operate with stability, so as not to adversely influence all the potentials within the operation range. However, the fixed potential generator 36 is liable to be affected by manufacturing discrepancies in the circuit configuration elements, requiring detailed adjustments and the like in order to ensure a stable supply of gate potential VRG. An increased circuit configuration is needed in order to perform these adjustments, consequently increasing the scale of the sense amplifier and eventually leading to greater manufacturing costs.

SUMMARY OF THE INVENTION

The present invention aims provide a non-volatile semiconductor memory apparatus capable of stable and correct reading of data from a memory cell transistor which stores multi-value data.

In order to achieve the above objectives, the non-volatile semiconductor memory apparatus of the present invention comprises: a memory cell transistor having an insulated floating gate electrode in which a charge is stored, said memory cell transistor varies a resistance thereof, when enabled, in accordance with the amount of charge stored in said floating gate electrode; a plurality of reference transistors, having a same structure as said memory cell transistor and being disposed in a row therewith; a bit line, which connected to said memory cell transistor; a plurality of reference bit lines, which connected to said plurality of reference transistors; a write circuit for supplying a write clock having a predetermined cycle to said memory cell transistor and said plurality of reference transistors, and writing data to said memory cell transistor and said plurality of reference transistors; and a controller for detecting the resistances of said memory cell transistor and said plurality of reference transistors during leisure times in the writing operation of said write clock, stopping the supply of said write clock from said write circuit to said memory cell transistor when the detected resistance of said memory cell transistor reaches a purpose value corresponding to write data, and sequentially stopping the supply of said write clock from said write circuit to said plurality of reference transistors when the detected resistances of said plurality of reference transistors have reached a plurality of reference values which are set in steps.

According to the present invention, data are written into the memory cell transistor based on reference to values corresponding to write data. And, simultaneously, data are written into the plurality of reference transistors based on reference to a plurality of reference values which are set in steps. As a result, even when discrepancies have appeared in the characteristics of the memory cell transistor and the reference transistors, such discrepancies have no affect on the determining of write data.

In another aspect, the non-volatile semiconductor memory apparatus of the present invention comprises a plurality of memory cell transistors, having insulated floating gate electrodes in which a charge is stored, said memory cell transistors being disposed in rows and columns and varying resistances in accordance with the amount of charge stored in said floating gate electrodes; a plurality of reference transistors, having a same structure as said memory cell transistors, a predetermined number of said reference transistors being disposed for each row of said memory cell transistors; a plurality of bit lines, which connected to said plurality of memory cell transistors; said bit lines being provided along each column of said memory cell transistors; a plurality of reference bit lines, which connected to said plurality of reference transistors; a write circuit for supplying a write clock having a predetermined cycle to said memory cell transistor and said plurality of reference transistors, and writing data to said plurality of memory cell transistors and said plurality of reference transistors; and a controller for detecting the resistances of said plurality of memory cell transistors and said plurality of reference transistors during leisure times in the writing operation of said write clock, stopping the supply of said write clock from said write circuit to said plurality of memory cell transistors when the detected resistance of said memory cell transistors reach values corresponding to write data, and sequentially stopping the supply of said write clock from said write circuit to said plurality of reference transistors when the detected resistances of said plurality of reference transistors have reached a plurality of reference values which are set in steps; wherein said plurality of memory cell transistors are divided into separately-operated column units; said plurality of reference transistors and said plurality of reference bit lines are arranged in plurality of pairs in accordance with the divisions of said plurality of memory cell transistors; and each division unit of said memory cell transistors operates in conjunction with one pair from said plurality of reference transistors and said plurality of reference bit lines.

According to the present invention, when simultaneously writing data to the memory cell transistors and to the reference transistors, writing can be carried out independently for each division unit of the memory cell transistors. As a result, even when the memory cell transistors and the reference transistors are provided on the same row, the memory cell transistors can be divided into a plurality of divisions which can be independently operated. In such a case, discrepancies in the characteristics of the memory cell transistors are eliminated by obtaining reference values for determination from the reference transistors into which data are simultaneously written.

DESCRIPTION OF THE PREFERRED EMBODIMENTS

Figure 6:
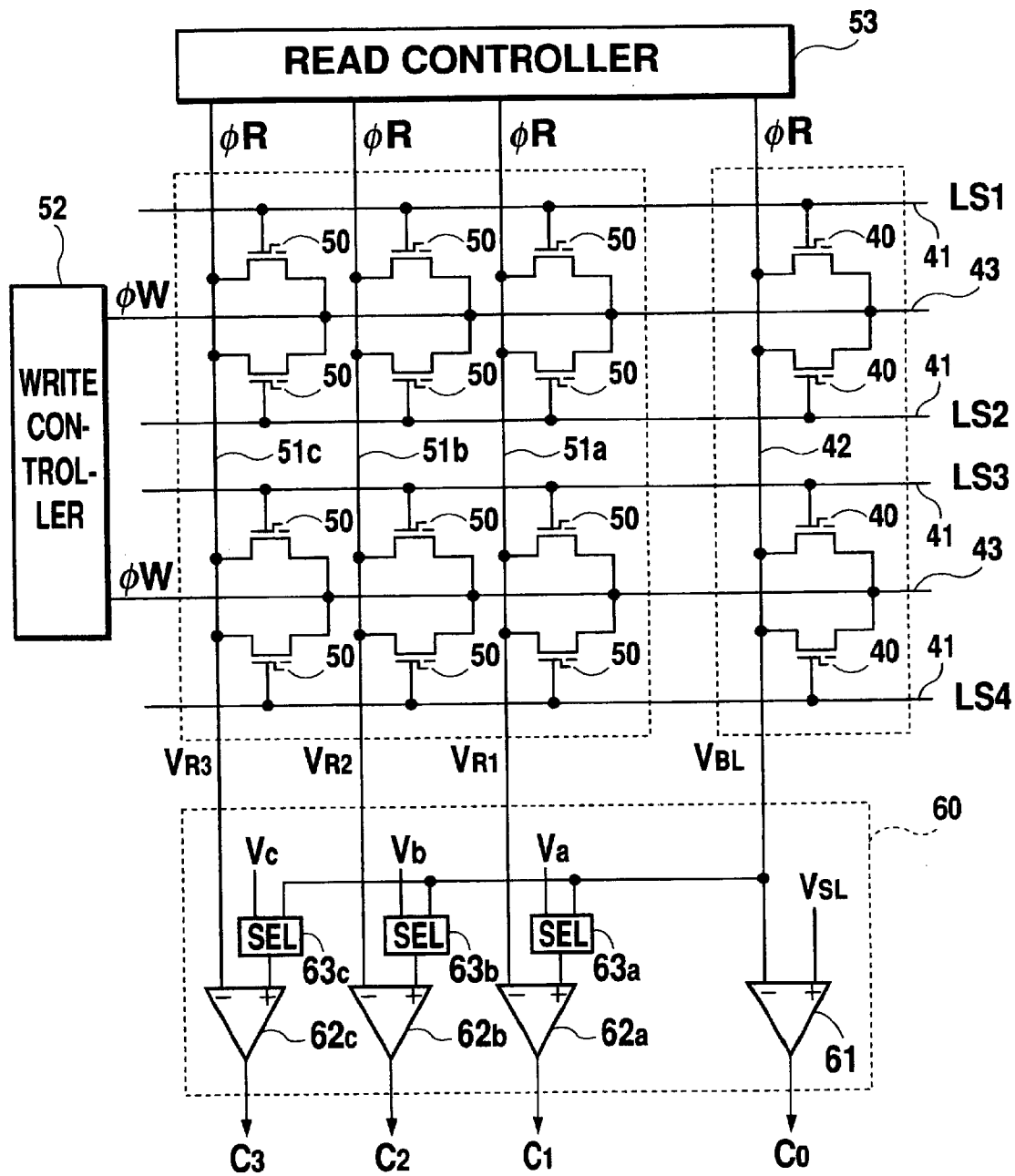
FIG. 6 is a circuit diagram for a non-volatile semiconductor memory apparatus according to a first embodiment of the present invention.

FIG. 6 is a circuit diagram for a non-volatile semiconductor memory apparatus according to a first embodiment of the present invention. FIG. 6 shows an example in which data of four values (two bits) are stored in memory cell transistors 40 and read out therefrom. Since the memory cell transistors 40 are arranged in four rows and one column, no circuit is needed for selecting columns.

Figure 1:
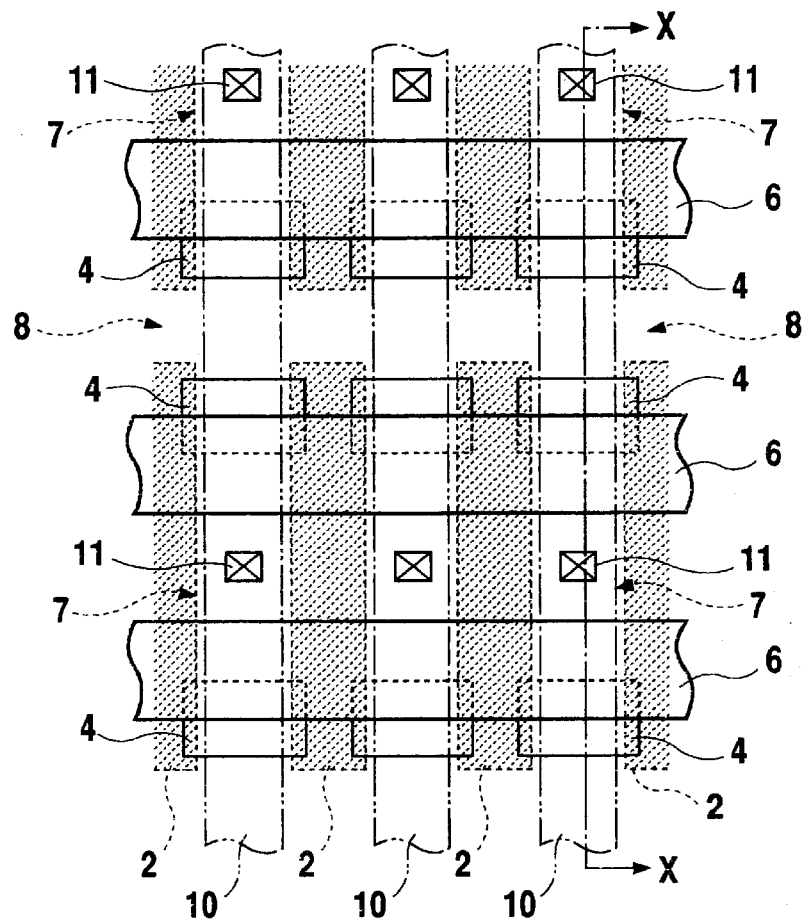
FIG. 1 is a front view of a configuration of a memory cell of a conventional non-volatile semiconductor memory apparatus.
Figure 2:
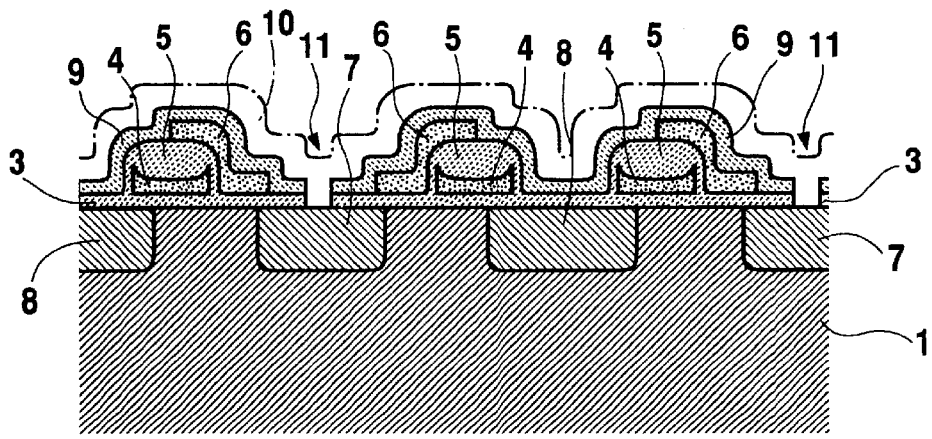
FIG. 2 is cross-sectional view taken along the line X—X of FIG. 1.
Figures 3, 4:
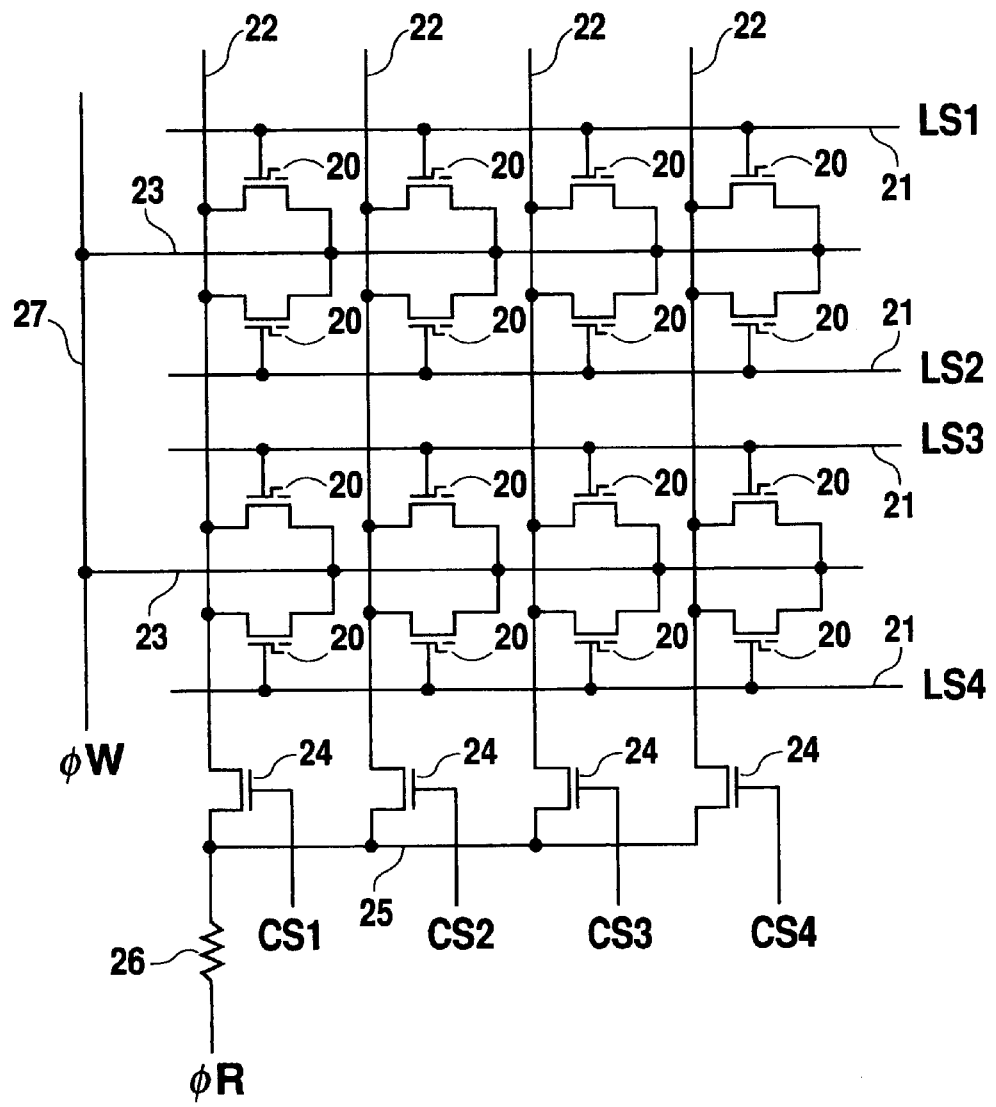
FIG. 3 is a circuit diagram for the configuration of a conventional non-volatile semiconductor memory apparatus.
FIG. 4 is a waveform diagram for a write clock and a read clock.
Figure 5:
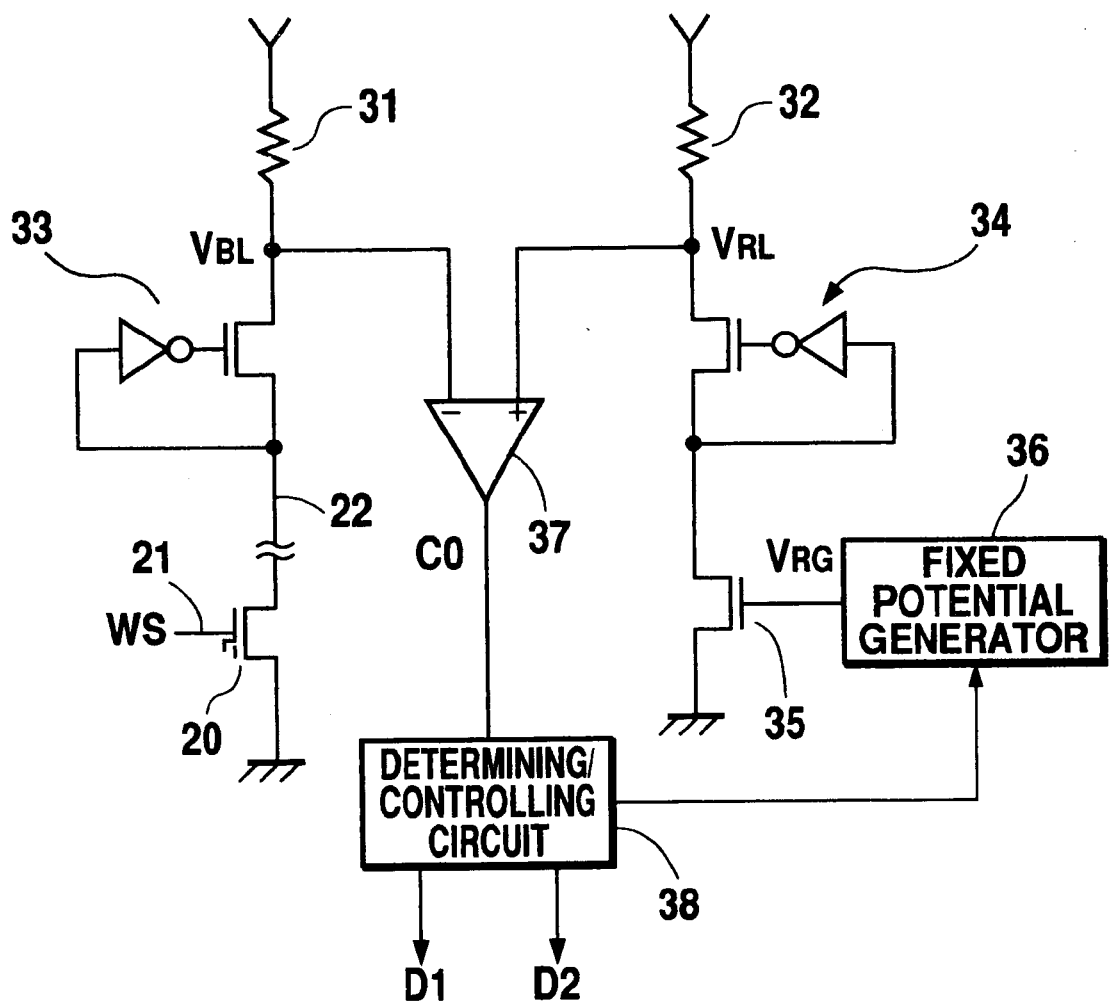
FIG. 5 is a circuit diagram illustrating a configuration of a sense amplifier.

The memory cell transistors 40 have the same structure as the memory cell transistors 20 depicted in FIG. 3, each having a floating gate electrode and a control gate electrode, and a resistance which varies according to the amount of electrical charge which is injected to (stored in) the floating gate electrode. A word line 41 is provided for each row of the memory cell transistors 40. The word lines 41 are connected to the control gate electrodes of the memory cell transistors 40. Row selecting signals LS1–LS4, supplied from a row decoder (not shown in the diagram) which receives row address information, are applied at the word lines 41, whereby one of the four rows is selected and activated. The bit line 42, which runs along the column of the memory cell transistors 40, is connected to the drain side of each memory cell transistor 40, and the source lines 43, which intersect the bit line, are connected to the source side of each memory cell transistor 40. Thus, the memory cell transistors 40 are connected in shunt with the bit line 42. When writing, reading or erasing data, the memory cell transistors 40 receive predetermined potentials from the bit line 42 and the source lines 43.

Reference transistors 50 have the same structure as the memory cell transistors 40. Three reference transistors 50 are provided in shunt on each row in order to obtain three reference values, which are required to identify the four data values. In the present embodiment, while four rows of memory cell transistors 40 are provided in a single column, the reference transistors 50 are provided in four rows and three columns. The control gate electrode of each reference transistor 50 is connected to the word line 41 to which the control gate electrode of the memory cell transistor 40 on the same row as the reference transistor 50 is connected. Moreover, the source side of each reference transistor 50 is connected to the source line 43 to which the source side of the memory cell transistor 40 on the same row as the reference transistor 50 is connected. First–third reference bit lines 51a–51c are provided down the columns of the reference transistors 50, one reference bit line being provided for each column, and are connected to the drain sides of the reference transistors 50.

A write controller 52, which each of the source lines 43 are connected to, supplies a write clock φW, having a fixed crest value and a fixed cycle, along the source lines 43 to the memory cell transistors 40 and to the reference transistors 50. Further, the write controller 52 connects the source lines 43 to a ground in synchronism with a read clock φR, which will be explained later. A read controller 53, which connects to the bit line 42 and the reference bit lines 51a–51c, supplies a read clock φR the potential of the read clock φR rising in the leisure times of the write clock φW, via the bit line 42 and the reference bit lines 51a–51c to the memory cell transistors 40 and the reference transistors 50. The read controller 53 includes a read load resistor. Potentials for reading, which are provided by the read clock φR, are supplied via the read load resistor to the bit line 42 and the reference bit lines 51a–51c. During the period prior to the inversion of a determining signal C0–C3 sent from a determining circuit 60, the read controller 53 connects the bit line 42 and the reference bit lines 51a–51c to ground in synchronism with the write clock φW. In other words, while reading out data in compliance with the read clock φR, when the read potentials of the bit line 42 and the reference bit lines 51a–51c (bit line potential VBL and reference potentials VR1–VR3) have reached their desired values, the potentials of the bit line 42 and the reference bit lines 51a–51c are increased.

The determining circuit 60 comprises four differential amplifiers 61, 62a–62c and three selectors 63a–63c. The potential VBL of the bit line 42 is input to the inverting input of the differential amplifier 61, and a signal potential VSL, which corresponds to stored data, is input to the noninverting input of the differential amplifier 61. The potentials VR1–VR3 of the reference bit lines 51a–51c are input to the inverting inputs of the differential amplifiers 62a–62c respectively, and selective outputs of the selectors 63a–63c are input to the noninverting inputs of the differential amplifiers 62a–62c. Three types of write reference potentials Va–Vc are input to the selectors 63a–63c respectively. In addition, the potential VBL of the bit line 42 is jointly input to the selectors 63a–63c. The selectors 63a–63c are selectively controlled in accordance with the operating mode of the apparatus. More specifically, during write mode, the selectors 63a–63c select the reference potentials Va–Vc; during read mode, the bit line potential VBL is selected. Here, 'read mode' denotes the read-out and playback of data which has been written to the memory cell transistor 40, not the reading operation which is carried out in compliance with the read clock φR repeating in alteration with the write clock φW.

The output C0 of differential amplifier 61 is used as a control signal to control the timing of the disconnection of the bit line 42 from the ground. Furthermore, during write mode, the outputs C1–C3 of the differential amplifiers 62a–62c are used as control signals to control the timing of the disconnection of the reference bit lines 51a–51c from the ground. Specifically, the output of differential amplifier 61 is inverted when the bit line potential VBL has reached the signal potential VSL. The differential amplifier 61 then sends an instruction to the read controller 53 to raise the potential of the bit line 42, and stops the write operation to the memory cell transistor 40. Similarly, the outputs of the differential amplifiers 62a–62c are inverted when the reference wire potentials VR1–VR3 have reached the respective write reference potentials Va–Vc, whereupon the differential amplifiers 62a–62c send instructions to cancel the ground connections of the reference bit lines 51a–51c, thereby stopping the write operation to the reference transistor 50. Further, in read mode, the outputs C1–C3 of the differential amplifiers 62a–62c are used for determining bit line potential VBL, that is to say, for determining multi-value data stored in the memory cell transistors 40.

Figure 7:
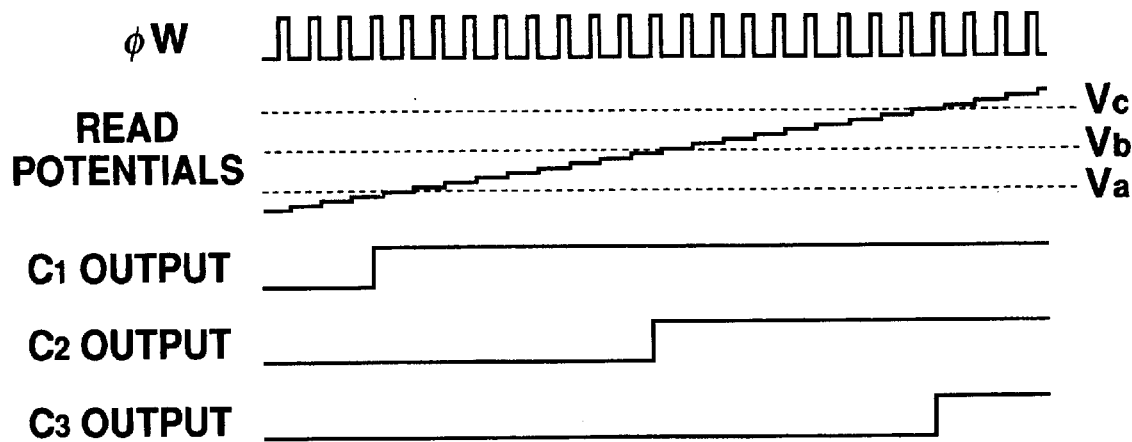
FIG. 7 is a timing chart illustrating the operation of the non-volatile semiconductor memory apparatus of the present invention.
Figure 8:
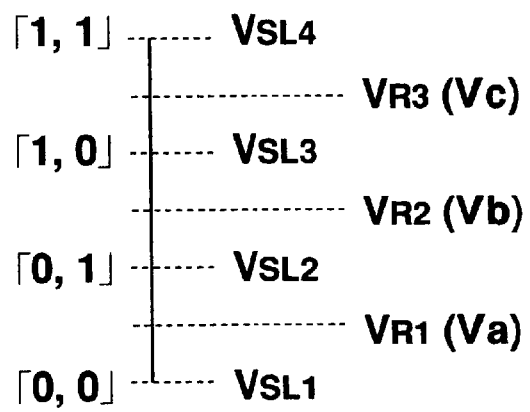
FIG. 8 is a diagram showing the relation between the reference potential during reading and the reference potential during writing.

As FIG. 7 shows, the read potentials of the first–third reference bit lines 51a–51c rise in steps in response to the write clock φW. And, when these read potentials exceed the write reference potentials Va–Vc, the outputs C1–C3, which have hitherto been at the low level, sequentially rise to the high level. As FIG. 8 shows, when data of four values (equivalent to two bits) are to be stored in the memory cell transistor 40, three determining potentials VR1–VR3 are generated from the middle values of four signal potentials VSL1–VSL4, which correspond to the four states of the data. The write reference potentials Va–Vc are set so as to correspond to the three determining potentials VR1–VR3. In general, the potential difference between power and ground is divided into six, and the second determining potential VR2 is set to ½ of the power potential, while the first and third determining potentials VR1 and VR3 are set respectively to ⅙ and ⅚ of the power potential.

When writing has been completed, the reference bit line potentials VR1–VR3, which are read out respectively from the reference bit lines 51a–51c, are in principle derived from the write reference potentials Va–Vc. In practise, however, some deviation is caused by discrepancies in the characteristics of the reference transistors 50. When such discrepancies exist in the characteristics of the reference transistors 50 and the memory cell transistors 40 as a result of manufacturing discrepancies, the discrepancies can be ignored by comparing the reference potentials VR1~VR3, obtained from the reference transistors 50, and the read potential VBL, obtained from the memory cell transistors 40, which have all been written according to an identical process.

Figure 9:
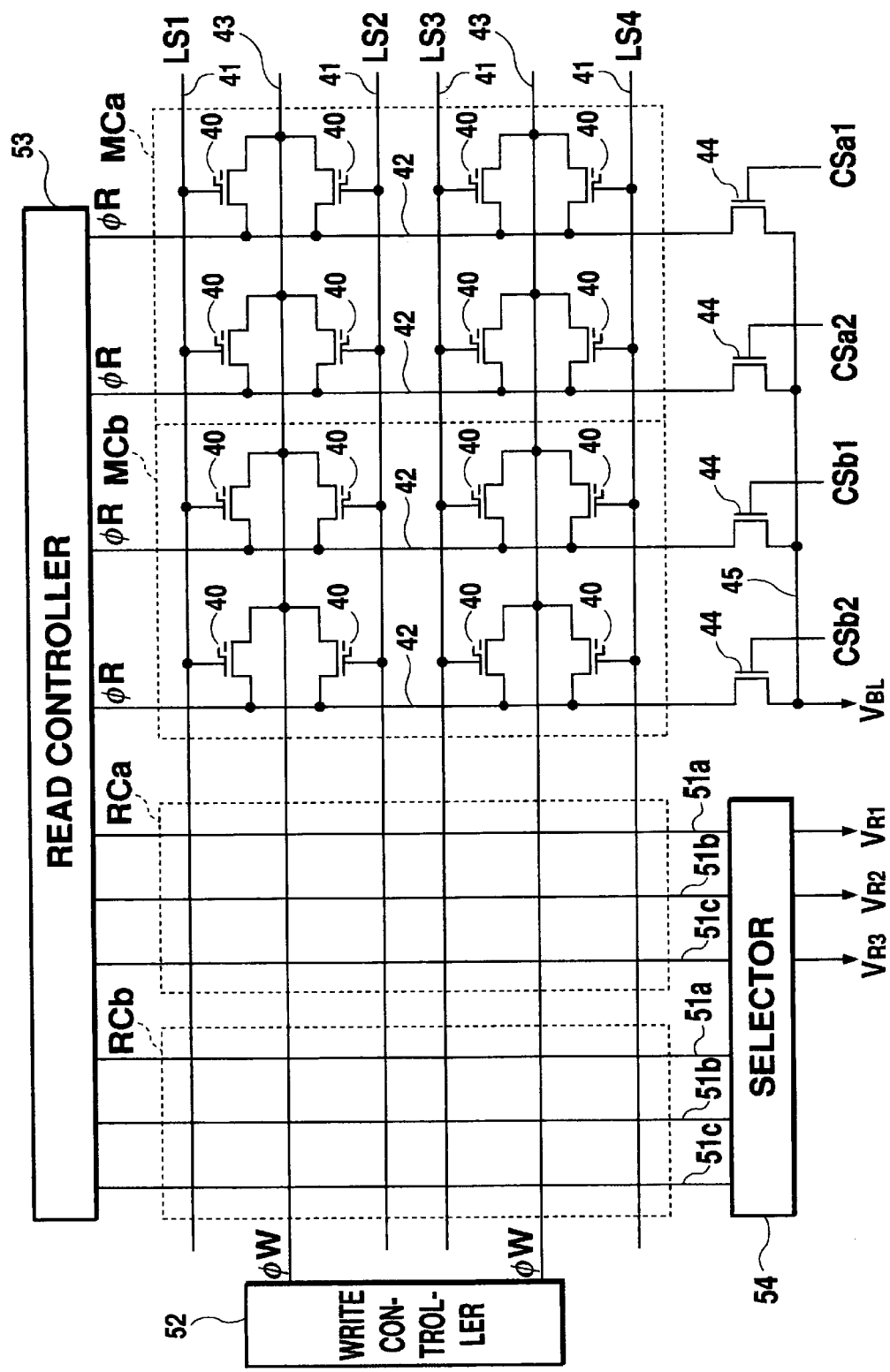
FIG. 9 is a circuit diagram for a non-volatile semiconductor memory apparatus according to a second embodiment of the present invention.

FIG. 9 shows a circuit diagram for a second embodiment of the non-volatile semiconductor memory apparatus of the present invention. As FIG. 9 shows, a four-by-four arrangement of memory cell transistors 40 is divided into two blocks MCa and MCb, of two columns each, which are operated independently. Not depicted in the diagram is a determining circuit 60, which has the same configuration as the determining circuit 60 of FIG. 6, for extracting the bit line potential VBL and the reference potentials VR1~VR3.

Each of the blocks MCa and MCb of memory cell transistors 40 has four rows and two columns, respectively having four word lines 41 and two bit lines 42. The word lines 41, which are provided for each row of memory cell transistors 40, are connected to the control gate electrodes of the memory cell transistors 40. Row selecting signals LS1~LS4, based on row address information, are applied at the word lines 41, whereby one of the four rows is selected and activated. The bit lines 42, which are provided for each column of the memory cell transistors 40, are connected to the drain sides of the memory cell transistors 40. Finally, the source lines 43, which intersect the bit lines 42, connect to the source side of the memory cell transistors 40.

The bit lines 42 are connected via selective transistors 44 to a data wire 45, which connects to the determining circuit 60. Column selecting signals CSa1, CSa2, CSb1 and CSb2, supplied from a column decoder (not shown in the diagram) which receives column selection information, are applied to the selective transistors 44. The two memory cell blocks operate according to separate timings. Therefore, the column selecting signals CSa1, CSa2, CSb1 and CSb2 are applied as appropriate to whichever memory cell block is to be activated. For instance, when activating the first memory cell block MCa and suspending the operation of the second memory cell block MCb, column selecting signals CSa1 and CSa2 become effective, but column selecting signals CSb1 and CSb2 remain fixed at the low level.

Two pairs of reference transistor blocks RCa and RCb, corresponding to the memory cell blocks MCa and MCb, are provided in parallel. As in FIG. 6, the reference transistor blocks RCa and RCb comprise four-by-three arrangements of reference transistors 50 (not shown in the diagram). The reference transistor blocks RCa and RCb are each provided with reference bit lines 51*a*~51*c*, which connect to a read controller 53 and a selector 54. The selector 54 selects one pair of reference bit lines 51*a*~51*c* of the reference transistor blocks RCa and RCb, and supplies determining potentials VR1~VR3, obtained from the reference bit lines 51*a*~51*c*, to the determining circuit 60. The selector 54 performs this selection in synchronism with the selection of the memory cell blocks MCa and MCb. In other words, one of the memory cell blocks MCa and MCb and one of the reference transistor blocks RCa and RCb operate together as a pair.

When selectively activating the two memory cell blocks MCa and MCb, changes in the operating environment may occur between the activation of the memory cell block Mca and MCb. For instance, in the case of a battery-operated portable computer or the like, when the power potential decreases as a result of battery consumption, there will be a difference between the signal potential used for activating one of the memory cell blocks MCa and MCb and the signal potential used for activating the other memory cell block. Nevertheless, when the memory cell blocks MCa and MCb and the reference transistor blocks RCa and RCb are operated in synchronism with each other, the deviation of the write level with respect to the memory cell transistors 40 and the deviation of the write level with respect to the reference transistors 50 become equal. Consequently, even when the memory cell blocks MCa and MCb are further divided into two separately-activated sections, stable operation can be maintained with no inaccurate determinations of the bit line potential VBL during reading.

Figure 10:
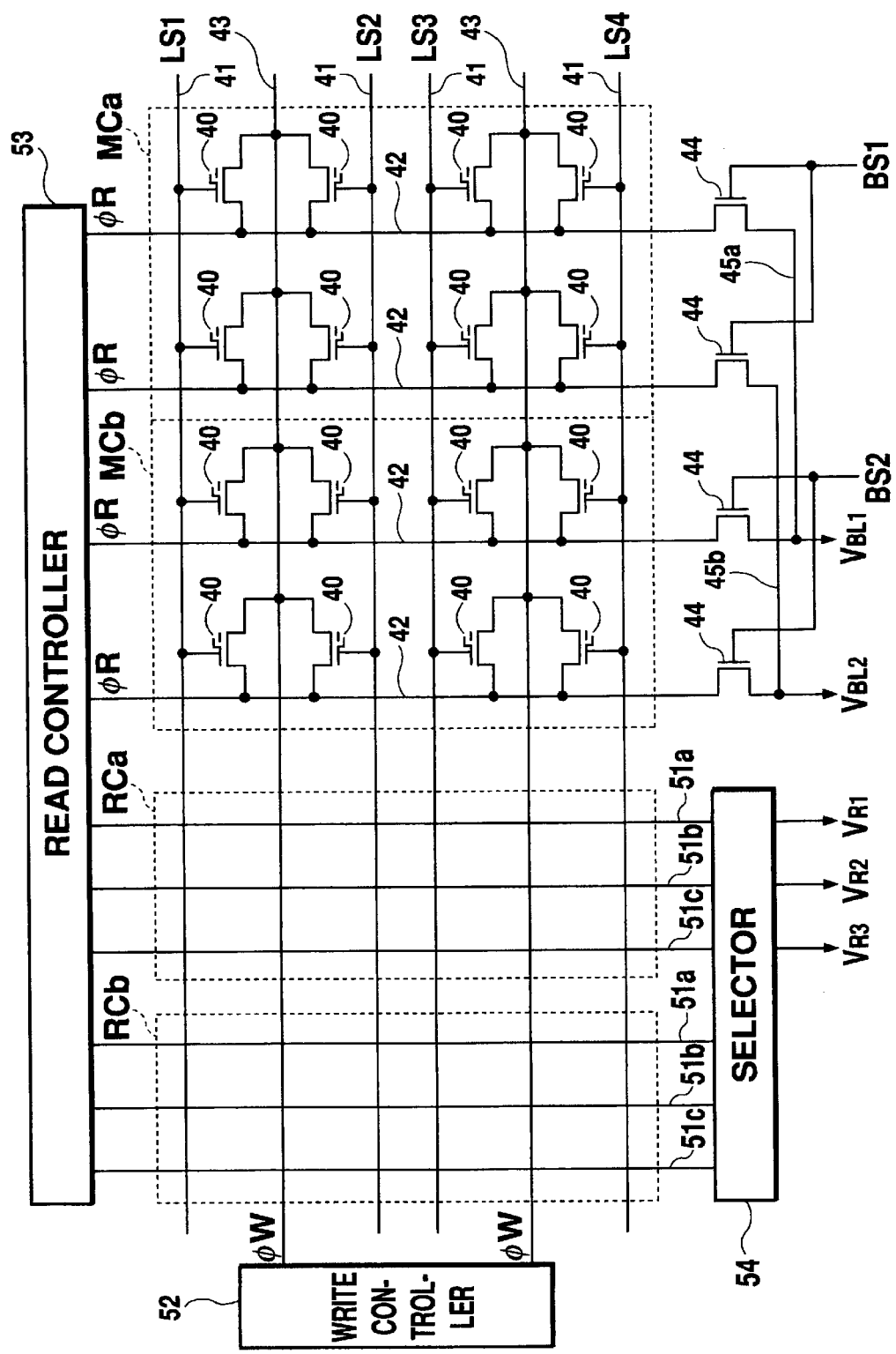
FIG. 10 is a circuit diagram for a non-volatile semiconductor memory apparatus according to a third embodiment of the present invention.

FIG. 10 shows a circuit diagram for a non-volatile semiconductor memory apparatus according to a third embodiment of the present invention. As FIG. 10 shows, a four-by-four arrangement of memory cell transistors 40 is divided into two blocks MCa and MCb of two columns each, wherein each column within the blocks MCa and MCb is operated independently. Not depicted in the diagram is a determining circuit 60, which has the same configuration as the determining circuit 60 of FIG. 6, for extracting the bit line potential VBL and the reference potentials VR1~VR3.

The memory cell blocks MCa and MCb are identical to those in FIG. 9, each comprising four rows and two columns, which respectively have four word lines 41 and two bit lines 42. The bit lines 42 are connected to a read controller 53 and, via the selective transistors 44, to data wires 45*a* or 45*b*. In the present embodiment, the two data wires 45*a* and 45*b* are provided respectively for the first columns and the second columns of the memory cell blocks MCa and MCb. The bit lines 42, which correspond to the first column of memory cell transistors 40 of the memory cell blocks MCa and MCb, are connected to the first data wire 45*a*; the bit lines 42, which correspond to the second column are connected to the second data wire 45*b*. Either one of the data wires 45*a* and 45*b* selectively connects to the determining circuit 60. Selecting signals BS1 and BS2, which select either one of the memory cell blocks MCa and MCb, are input to the selective transistors 44.

The columns of memory cell transistors 40 within the memory cell blocks MCa and MCb are activated according to separate timings, by connecting either one of the data wires 45*a* and 45*b*, which corresponds to the columns to be activated, to the determining circuit 60. For instance, when activating the first columns of memory cell transistors 40 of the memory cell blocks MCa and MCb while suspending the operations of the second columns of memory cell transistors 40, the first data wire 45*a* is connected to the determining circuit 60. The first data wire 45*a* thereby becomes effective, and the second data wire 45*b* remains ineffective.

The reference transistor blocks RCa and RCb are identical to those in FIG. 9, being provided in four rows and three columns, with word lines 41 and reference bit lines 51*a*~51*c* corresponding to each row and each column of reference transistors 50. Also, selector 54 is identical to the one shown in FIG. 9, supplying selected determining potentials VR1~VR3 to the determining circuit 60. The selector 54 performs the selection in synchronism with the selection of the data wires 45*a* and 45*b*, namely, in synchronism with the selection of the column of memory cell transistors 40 to be activated. Thus, one of the columns of memory cell transistors 40, within the memory cell blocks MCa and MCb, and one of the reference transistor blocks RCa and RCb operate together as a pair. Consequently, as in FIG. 9, even when each column of memory cell transistors 40 operates independently from the other columns, stable operation can be maintained with no inaccurate determinations of the bit line potential VBL during reading.

The above embodiments described a case where four data values were stored in the memory cell transistors 40, but the data to be stored is not limited to four values; eight values (equivalent to three bits), or sixteen values (four bits) or greater numbers can also be stored. In such cases, a number of reference transistors, in accordance with the number of values to be determined, are provided on each row. For instance, when reading out three bits of data from a single memory cell transistor 40, seven columns of reference transistors should be provided in order to be capable of determining eight values.

Furthermore, the number of divisions of memory cell transistors is not limited to two; three or more divisions are equally possible. When the memory cell blocks are to be operated independently, the number of reference transistor blocks provided must accord with the number of divisions of the memory cell transistors. Or, when the columns of memory cell transistors within each memory cell block are to be operated independently, the number of reference transistor blocks provided must accord with the number of columns of the memory cell transistors.

According to the present invention, determination reference values are read out from reference transistors which are provided in shunt with the memory cell transistors. Consequently, inaccurate determining of memory data is prevented, even when discrepancies have arisen in the characteristics of the memory cell transistors or the reference transistors. Therefore, the read operation margin can be widened, increasing the number of bits which can be stored in a single memory cell transistor and facilitating high-speed accessing of data.

Furthermore, when a plurality of memory cell transistors are provided in a single row, it is possible to divide the transistors into blocks, enabling the memory cell regions to be utilized more efficiently.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A non-volatile semiconductor memory apparatus, comprising:
    a memory cell transistor, having an insulated floating gate electrode in which a charge is stored, said memory cell transistor varies a resistance thereof, when enabled, in accordance with an amount of charge stored in said floating gate electrode; a plurality of reference transistors, having a same structure as said memory cell transistor and being disposed in a row therewith; a bit line, which connected to said memory cell transistor; a plurality of reference bit lines, which connected to said plurality of reference transistors; a write circuit for supplying a common write clock having a predetermined cycle to said memory cell transistor and said plurality of reference transistors, and writing data to said memory cell transistor and said plurality of reference transistors; and a controller for detecting the resistances of said memory cell transistor and said plurality of reference transistors during leisure times in the writing operation of said write clock, stopping the supply of said write clock from said write circuit to said memory cell transistor when the detected resistance of said memory cell transistor reaches a purpose value corresponding to write data, and sequentially stopping the supply of said write clock from said write circuit to said plurality of reference transistors when the detected resistances of said plurality of reference transistors have reached a plurality of reference values which are set in steps.

2. A non-volatile semiconductor memory apparatus according to claim 1, wherein
    a plurality of said memory cell transistors are connected in parallel to said bit line, thereby forming a memory cell transistor column;
    said plurality of reference transistors are connected in parallel to said plurality of reference bit lines, thereby forming a plurality of reference transistor columns; and wherein
    a memory cell transistor and a plurality of reference transistors, which are provided on the same row of each column, can be simultaneously enabled.

3. A non-volatile semiconductor memory apparatus, comprising:
    a plurality of memory cell transistors, having insulated floating gate electrodes in which a charge is stored, said memory cell transistors being disposed in rows and columns and varying resistances in accordance with the amount of charge stored in said floating gate electrodes; a plurality of reference transistors, having a same structure as said memory cell transistors, a predetermined number of said reference transistors being disposed for each row of said memory cell transistors; a plurality of bit lines, which connected to said plurality of memory cell transistors; said bit lines being provided along each column of said memory cell transistors; a plurality of reference bit lines, which connected to said plurality of reference transistors; a write circuit for supplying a common write clock having a predetermined cycle to said memory cell transistor and said plurality of reference transistors, and writing data to said plurality of memory cell transistors and said plurality of reference transistors; and a controller for detecting the resistances of said plurality of memory cell transistors and said plurality of reference transistors during leisure times in the writing operation of said write clock, stopping the supply of said write clock from said write circuit to said plurality of memory cell transistors when the detected resistance of said memory cell transistors reach values corresponding to write data, and sequentially stopping the supply of said write clock from said write circuit to said plurality of reference transistors when the detected resistances of said plurality of reference transistors have reached a plurality of reference values which are set in steps; wherein
        said plurality of memory cell transistors are divided into separately-operated column units; said plurality of reference transistors and said plurality of reference bit lines are arranged in plurality of pairs in accordance with the divisions of said plurality of memory cell transistors; and each division unit of said memory cell transistors operates in conjunction with one pair from said plurality of reference transistors and said plurality of reference bit lines.

4. A non-volatile semiconductor memory cell apparatus according to claim 3, wherein said plurality of memory cell transistors are divided into a plurality of blocks, each block comprising a predetermined number of columns, and each of said blocks corresponding to one pair from said plurality of reference transistors and said memory cell transistors.

5. A non-volatile semiconductor memory cell apparatus according to claim 3, wherein said plurality of memory cell transistors are divided into a plurality of blocks, each block comprising a predetermined number of columns, and each column of said plurality of memory cell transistors within each block corresponds to one pair from said plurality of reference transistors and said memory cell transistors.

6. A non-volatile semiconductor memory apparatus, comprising:

a memory cell transistor, having an insulated floating gate electrode in which a charge is stored, said memory cell transistor varying in accordance with an amount of charge accumulating at said floating gate electrode;

a source line, connected to the source of said memory cell transistor;

a word line, connected to the gate of said memory cell transistor;

a bit line, connected to the drain of said memory cell transistor;

a plurality of reference transistors, having the same structure as said memory cell transistor, the sources of said reference transistors being connected to said source line and the gates of said reference transistors being connected to said word line;

a plurality of reference bit lines, separately connected to the drains of said plurality of reference transistors;

a source line voltage-controlled circuit, connected to said source line, for supplying a common write clock, having a predetermined cycle, to said memory cell transistor and said plurality of reference transistors during writing thereto;

a bit line voltage-controlled circuit, for independently controlling potentials of said bit line and said plurality of reference bit lines, and detecting the resistances of said memory cell transistor and said plurality of reference transistors; and a memory level controller, a plurality of differing reference values corresponding to said plurality of reference transistors being set in steps in said memory level controller, wherein, during said reading, which is repeated during leisure times in the writing operation of said write clock, when a resistance of said memory cell transistor, when enabled, has reached a value corresponding to desired write data, said memory level controller stops the writing to the memory cell transistor, and when resistances of said reference transistors have reached said reference values corresponding thereto, said memory level controller stops the writing to said reference transistors.

7. A non-volatile semiconductor memory apparatus according to claim 6, further comprising:

a plurality of said memory cell transistors, which are connected in parallel between said source line and said word line, thereby forming a row of transistors comprising said reference transistors and said plurality of memory cell transistors; and a plurality of said bit lines, corresponding to each of said memory cell transistors contained in said transistor row.

8. A non-volatile semiconductor memory apparatus according to claim 7, further comprising a plurality of transistor rows; wherein said memory cell transistors, corresponding to each of said transistor rows, are connected in parallel to said bit lines, thereby forming columns of memory cell transistors; and said reference transistors, corresponding to each of said transistor rows, are connected in parallel to said reference bit lines, thereby forming columns of reference transistors.

9. A non-volatile semiconductor memory apparatus according to claim 8, further comprising:

a plurality of blocks of reference transistors, said blocks comprising a plurality of reference transistors, corresponding to said plurality of reference values which are set in steps, and said reference bit lines, corresponding to said reference transistors, and a number of said blocks being determined in accordance with a number of groups of said memory cell transistors, which have been divided in compliance with said memory cell transistor columns.

* * * * *